United States Patent
Ohkawa et al.

(10) Patent No.: US 8,085,236 B2
(45) Date of Patent: Dec. 27, 2011

(54) DISPLAY APPARATUS AND METHOD FOR DRIVING THE SAME

(75) Inventors: Hiroyuki Ohkawa, Matsusaka (JP); Yuhichiroh Murakami, Matsusaka (JP); Sachio Tsujino, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 722 days.

(21) Appl. No.: 12/087,887

(22) PCT Filed: Nov. 30, 2006

(86) PCT No.: PCT/JP2006/323906
§ 371 (c)(1), (2), (4) Date: Jul. 17, 2008

(87) PCT Pub. No.: WO2007/108177
PCT Pub. Date: Sep. 27, 2007

(65) Prior Publication Data
US 2009/0121998 A1 May 14, 2009

(30) Foreign Application Priority Data
Mar. 23, 2006 (JP) .................. 2006-081641

(51) Int. Cl.
*G09G 3/36* (2006.01)
(52) U.S. Cl. .......................................... 345/100; 345/98
(58) Field of Classification Search .................... 345/87, 345/89, 98–100, 204, 690
See application file for complete search history.

(56) References Cited

U.S. PATENT DOCUMENTS

| | | | |
|---|---|---|---|
| 5,859,630 A * | 1/1999 | Huq ............................. | 345/100 |
| 6,876,352 B1 * | 4/2005 | Sato et al. ...................... | 345/100 |
| 7,098,880 B2 | 8/2006 | Inoue et al. | |
| 7,151,524 B2 * | 12/2006 | Polgar et al. .................. | 345/156 |
| 7,515,134 B2 * | 4/2009 | Katayama ..................... | 345/100 |
| 7,538,753 B2 * | 5/2009 | Tanada .......................... | 345/100 |
| 7,859,510 B2 * | 12/2010 | Umezaki ....................... | 345/100 |
| 2002/0075249 A1 | 6/2002 | Kubota et al. | |
| 2003/0174115 A1 | 9/2003 | Washio et al. | |
| 2003/0218593 A1 | 11/2003 | Inoue et al. | |
| 2004/0104908 A1 | 6/2004 | Toyozawa et al. | |
| 2004/0150610 A1 | 8/2004 | Zebedee et al. | |
| 2005/0243588 A1 | 11/2005 | Kubota et al. | |
| 2006/0145998 A1 * | 7/2006 | Cho et al. ...................... | 345/100 |
| 2007/0146354 A1 | 6/2007 | Kubota et al. | |
| 2007/0290968 A1 | 12/2007 | Toyozawa et al. | |

FOREIGN PATENT DOCUMENTS

| | | |
|---|---|---|
| JP | 02-272490 | 11/1990 |
| JP | 08-062577 | 3/1996 |
| JP | 2000-339984 | 12/2000 |
| JP | 2000-347627 | 12/2000 |
| JP | 2000-347927 | 12/2000 |
| JP | 2002-202747 | 7/2002 |
| JP | 2003-295829 | 10/2003 |
| JP | 2004-045785 | 2/2004 |
| JP | 2004-227751 | 8/2004 |

* cited by examiner

*Primary Examiner* — Duc Dinh
(74) *Attorney, Agent, or Firm* — Harness, Dickey & Pierce, P.L.C.

(57) ABSTRACT

A liquid crystal display apparatus (1) wherein the shift registers of a source driver (4) are configured by use of asynchronous RS flip-flops in which an active input to a set input terminal has a higher priority than an active input to a reset terminal. In a second mode of operation, first and second clock signals and a start pulse are fixed at high levels, thereby performing discharges from all the pixels (PIX) of a liquid crystal panel (2).

5 Claims, 12 Drawing Sheets

FIG. 2
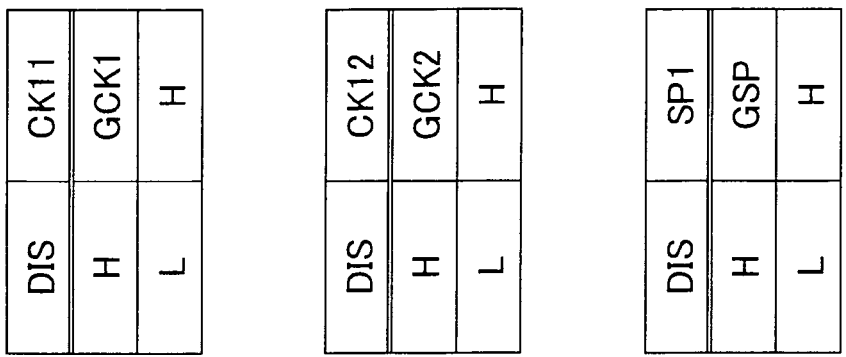
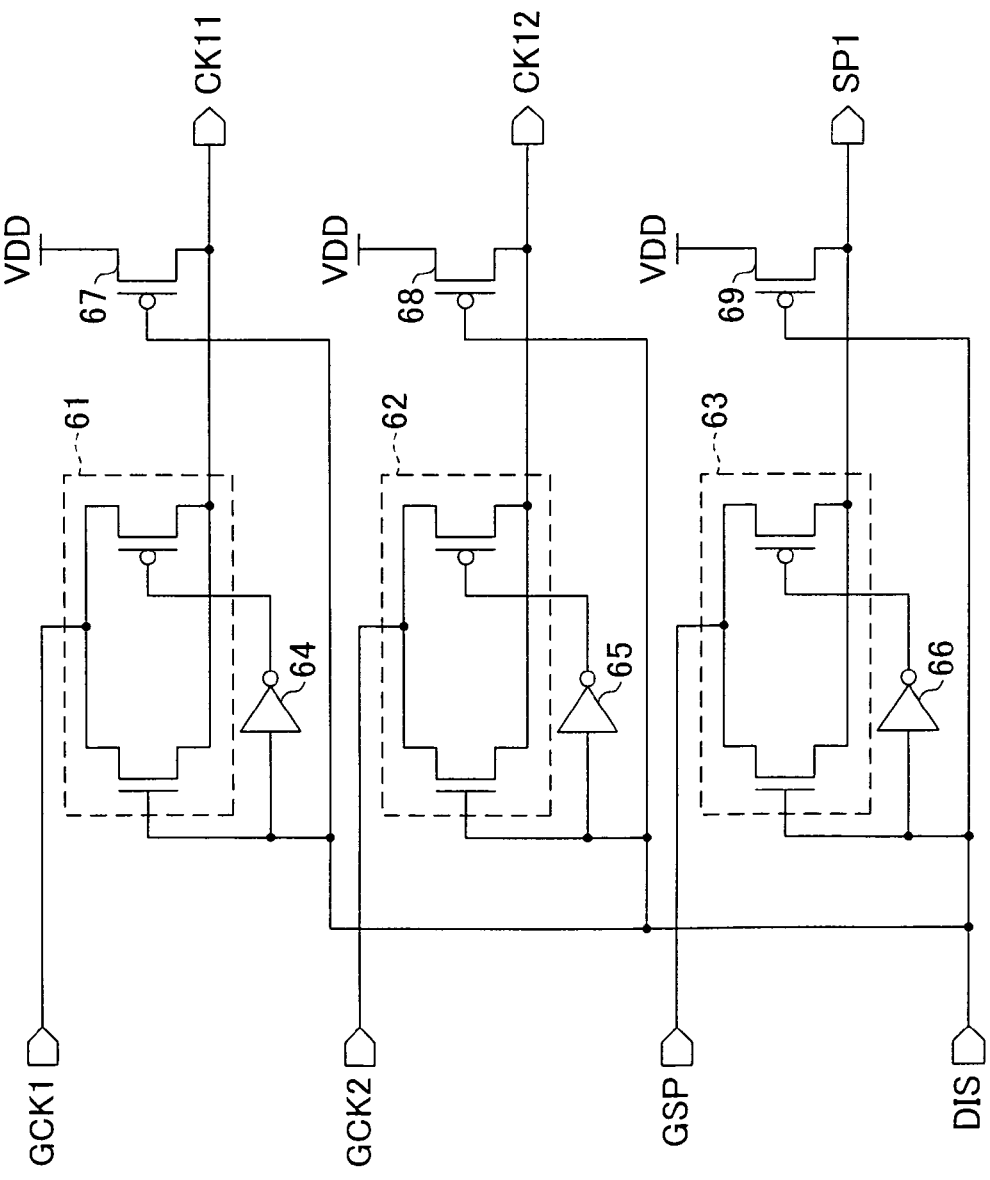

(a)

(b)

| SB | R | $O_{n-1}$ | $O_n$ | $OB_n$ |
|---|---|---|---|---|
| H | H | – | L | H |
| H | L | L | L | H |
| H | L | CK | CK | CKB |
| L | H | – | CK | CKB |
| L | L | – | CK | CKB |

(a)

(b)

| SB | R | Q |
|---|---|---|
| H | H | L |
| H | L | $Q_{n-1}$ |
| L | H | H |
| L | L | H |

DISPLAY APPARATUS AND METHOD FOR DRIVING THE SAME

TECHNICAL FIELD

The present invention relates to display devices which display images by charging pixels, such as an active matrix liquid crystal display.

BACKGROUND ART

In an active matrix liquid crystal display which displays images by charging pixels through TFTs, some pixels accumulating positive charge and the other pixels accumulating negative charge are mixed together on a display panel when the display panel is driven by applying alternating voltage. Therefore, when the liquid crystal display turns OFF, pixel electrode potential based on counter electrode potential varies depending on the polarity of pixels, accumulating positive charge or negative charge, right before the turning OFF the liquid crystal display device. This tends to cause a leakage of electric charge to a data signal line from a group of pixels, either accumulating positive or negative charge, which has larger potential difference to a potential of data signal line when the liquid crystal display turns OFF. As a result, voltage applied to each of the pixels becomes ununiform, which may cause degradation of the displayed image. Also, in the process of boot up after turning ON the display, electric charge is accumulated to a pixel due to a potential generated in a video signal line or a counter electrode until a logic of a driving circuit is established in the liquid crystal display. This may also cause the image degradation.

As a counter measure to this kind of problem, a conventional configuration illustrated in FIG. 12 is proposed (see Patent Document 1 as an example).

A liquid crystal display device 101 illustrated in FIG. 12 includes a liquid crystal panel 102, a gate driver 103, a source driver 104, a scan signal supply control circuit 105, a data signal supply control circuit 106, and a pixel discharge circuit 107.

The liquid crystal panel 102 is an active matrix display panel including a plurality of scan signal lines GL (1), GL (2), . . . , GL (n), . . . and a plurality of data signal lines SL (1), SL (2), . . . , SL (N), . . . provided so as to be intersected with each other. In each intersection, a pixel PIX is provided. The pixel PIX includes a TFT 102*a*, a liquid crystal capacitor 102*b*, and a storage capacitor 102*c*. A gate terminal of the TFT 102*a* is connected to a scan signal line GL corresponding to the pixel PIX. One source/drain terminal of the TFT 102*a* is connected to a data signal line SL corresponding to the pixel PIX. The other source/drain terminal of the TFT 102*a* is connected to a pixel electrode corresponding to the pixel PIX. The liquid crystal capacitor 102*b* and the storage capacitor 102*c* are connected to the pixel PIX between the pixel electrode and a counter electrode COM so as to be parallel to each other.

In the gate driver 103, in response to externally supplied clock signals GCK 1, GCK 2, and a gate start pulse GSP, an internal shift register and a logical circuit generate, at each stage, a signal for producing a scan signal which is to be supplied to a scan signal line GL. In the source driver 104, in response to externally supplied clock signals SCK 1, SCK 2, and a source start pulse signal SSP, an internal shift register generates, at each stage, a signal for producing a controlling signal for an analogue switch B in a data signal supply control circuit 106 (later described).

The scan signal supply control circuit 105 includes a plurality of NAND circuits 105*a*-1, 105*a*-2, . . . , 105*a*-*n*, . . . , which carry out a NAND operation between the scan signal generated by the gate driver 103 and an externally supplied discharge control signal DIS, provided corresponding to the scan signal lines GL (1), GL (2), . . . , GL (n), . . . , respectively.

The data signal supply control circuit 106 includes a plurality of NAND circuits 106*a*-1, 106*a*-2, . . . , 106*a*-N, . . . , which carry out a NAND operation between the signal generated by the source driver 104 and the externally supplied discharge control signal DIS, provided corresponding to the data signal lines SL (1), SL (2), . . . , SL (N), . . . , respectively. The data signal supply control circuit 106 includes a plurality of CMOS analogue switches B1, B2, . . . , BN, . . . which transform signals generated by NAND circuits 106*a*-1, 106*a*-2, . . . , 106*a*-N, . . . to control signals, respectively. To a gate terminal of a p-channel type MOS transistor of the analogue switch B, a signal generated by a corresponding NAND circuit 106*a* is directly inputted. To a gate terminal of an n-channel type MOS transistor, a signal generated by a NAND circuit 106*a*, which is level inverted by an inverters b (inverters b1, b2, . . . , bN, . . . corresponding to the NAND operation circuits 106*a*-1, 106*a*-2, . . . , 106*a*-N, . . . , respectively), is inputted. The analogue switches B1, B2, . . . , BN, . . . are provided corresponding to the data signal lines SL (1), SL (2), . . . , SL (N), . . . , respectively, so as to open and close the connection between the data signal line SL and the video signal line VSIG.

The pixel discharge circuit 107 includes CMOS analogue switches A1, A2, . . . , AN, . . . , which are provided corresponding to the data signal lines SL (1), SL (2), . . . , SL (N), . . . , respectively. As a control signal of the analogue switch A, the discharge control signal DIS is used. To a gate terminal of an n-channel type MOS transistor of the analogue switch A, the discharge control signal DIS, which is level inverted by an inverter a (inverters a1, a2, . . . aN, . . . corresponding to the data signal lines SL (1), SL (2), . . . , SL (N), . . . , respectively), is inputted. To a gate terminal of a p-channel type MOS transistor, the discharge control signal DIS is inputted directly.

The liquid crystal display device 101 with the above configuration, the discharge control signal DIS goes High when the liquid crystal display device 101 is in normal operation. At this time, all the analogue switches A1, A2, . . . AN, . . . turn OFF in union, and each of the analogue switches B1, B2, . . . , BN, . . . in the data signal supply control circuit 106 turns ON sequentially because when the output signal from the stage corresponding to the source driver 104 goes High, the output signal from the corresponding NAND circuit 106*a* goes Low. Then, the gate driver 103 outputs Low signal from each of the stages sequentially, however, the NAND circuit 105*a* outputs High scan signal to the corresponding scan signal line GL when the output signal from the stage corresponding to the gate driver 103 goes Low. Accordingly, the pixel PIX which has an ON state TFT 102*a* is charged by a video signal supplied from the video signal line VSIG via a closed analogue switch B. This realizes image display.

On the other hand, when the liquid crystal display device 101 turns OFF or ON, the discharge signal DIS goes Low right before the turning OFF or ON the display device. Accordingly, all the NAND circuits in the data signal supply control circuit 106, 106*a*-1, 106*a*-2, . . . , 106*a*-N, . . . , output High signal in union, and all the analogue switches B1, B2, . . . , BN, . . . turn OFF in union. Also, all the analogue switches in the pixel discharge circuit 107, A1, A2, . . . , AN, . . . , turn ON in union. Further, all the NAND circuits in the scan signal supply control circuit 105, 105*a*-1, 105*a*-2, . . . , 105*a*-*n*, . . . , output High signal in union, and all the TFTs 102*a* in the pixels PIX turn ON in union.

This allows the pixels PIX to discharge all together because the pixel electrode of each pixel PIX is connected to the counter electrode COM (charge from the counter electrode COM in other words). Therefore, each applied voltage to the liquid crystal capacitor 102b and to the storage capacitor 102c of each pixel PIX becomes zero voltage. This can prevent the image degradation when the liquid crystal display device 101 turns ON or OFF.

[Patent Document 1] Japanese Unexamined Patent Publication, Tokukai 2000-347627 (date of publication Dec. 15, 2000)

[Patent Document 2] Japanese Unexamined Patent Publication, Tokukai 2004-45785 (date of publication Feb. 12, 2004)

DISCLOSURE OF INVENTION

However, the liquid crystal display device 101 with the above conventional configuration requires a space for NAND circuits 105a-1, 105a-2, . . . , 105a-n, . . . to prevent degradation of displayed image when the display turns ON and OFF. Therefore, it is a problem that there is a limitation in downsizing of the liquid crystal display and efficient utilization of the area.

The present invention is made in view of the forgoing problem. Objects of the present invention are to realize (i) a display device, which can prevent the image degradation when the display turns ON and OFF with use of a circuit which does not hamper downsizing and efficient area utilization, and (ii) a driving method the same.

To attain the object, a display device of the present invention in which an active matrix display panel is driven by a driving circuit with use of an output signal from a shift register, the driving circuit including the shift register, wherein the shift register includes stages connected in a cascade fashion, each stage including an RS flip-flop in which an active input to a set input terminal has a higher priority than an active input to a reset input terminal, the RS flip-flop acting as a data latch circuit; and the shift register performs: a first mode of operation in which (i) a certain pulse is supplied to a set input terminal of the RS flip-flop of a predetermined stage among the stages, (ii) the certain pulse is passed sequentially downstream through the predetermined stage and its subsequent stage(s) at timing indicated by timing signals for the predetermined stage and its subsequent stage(s) and (iii) the output signal is outputted sequentially from the predetermined stage and its subsequent stage(s) as a pulse in response to the timing signal; and a second mode of operation in which all the output signals are set to be active in union by supplying an active input to the set input terminal of the RS flip-flop in first one of the stages.

According to the present invention, the normal display operation is able to be carried out by the sequential pulse output in the first mode of operation with use of the RS flip-flop in which an active input to a set input terminal has a higher priority than an active input to a reset input terminal, and the second mode of operation enables to output active signal in union with use of the feature in which an active input to a set input terminal has a higher priority than an active input to a reset input terminal. For example, if the second mode of operation is used in turning OFF a display device driven by applying alternating voltage, it is possible to discharge pixels and to offset positive charge and negative charge among pixels. On the other hand, if the second mode of operation is used in turning ON a certain display device, it is possible to equalize the amount of charge among pixels. Therefore, the second mode of operation is capable of preventing the image degradation in turning ON and OFF a display device without installing extra circuits such as NAND circuits provided corresponding to respective outputs from the driving circuit.

As described above, the present invention realizes a display device which can prevent the image degradation when the display turns ON and OFF with use of a circuit which does not hamper downsizing and efficient area utilization of the display device.

To attain the object, a method for driving a display device in which an active matrix display panel is driven by a driving circuit with use of an output signal from a shift register, the driving circuit including the shift resister having stages connected in a cascade fashion, each stage including an RS flip-flop in which an active input to a set input terminal has a higher priority than an active input to a reset input terminal, the RS flip-flop acting as a data latch circuit, the method including: performing a first mode of operation in which (i) a certain pulse is supplied to a set input terminal of the RS flip-flop of a predetermined stage among the stages, (ii) the certain pulse is passed sequentially downstream through the predetermined stage and its subsequent stage(s) at timing indicated by timing signals for the predetermined stage and its subsequent stage(s) and (iii) the output signal is outputted sequentially from the predetermined stage and its subsequent stage(s) as a pulse in response to the timing signal; and performing a second mode of operation in which all the output signals are set to be active in union by supplying an active input to the set input terminal of the RS flip-flop in first one of the stages.

According to the present invention, the normal display operation is able to be carried out by the sequential pulse output in the first mode of operation with use of the RS flip-flop in which an active input to a set input terminal has a higher priority than an active input to a reset input terminal, and the second mode of operation enables to output active signal in union with use of the feature in which an active input to a set input terminal has a higher priority than an active input to a reset input terminal. For example, if the second mode of operation is used in turning OFF a display device driven by applying alternating voltage, it is possible to discharge pixels and to offset positive charge and negative charge among pixels. On the other hand, if the second mode of operation is used in turning ON a certain display device, it is possible to equalize the amount of charge among pixels. Therefore, the second mode of operation is capable of preventing the image degradation in turning ON and OFF a display device without installing extra circuits such as NAND circuits provided corresponding to respective outputs from the driving circuit.

As described above, the present invention realizes a driving method of a display device which can prevent the image degradation when the display turns ON and OFF with use of a circuit which does not hamper downsizing and efficient area utilization of the display device.

Other objectives, characteristics, and advantages of the present invention shall become clear according to the following description. Also, benefits of the present invention shall become clear according to the following description with reference to the accompanying drawings.

BRIEF DESCRIPTION OF DRAWINGS

FIG. 2 (*a*) is a circuit diagram illustrating a configuration of a driving signal source processing circuit in the liquid crystal display device in FIG. 1.

FIG. 2 (*b*) is a table of truth value for FIG. 2 (*a*).

FIG. 4 (*b*) is a table of truth value for FIG. 4 (*a*).

FIG. 5 (*b*) is a table of truth value for FIG. 5 (*a*).

FIG. 11 (*b*) is a waveform chart of a clock signal for the driving circuit in FIG. 11 (*a*).

Figure 1:
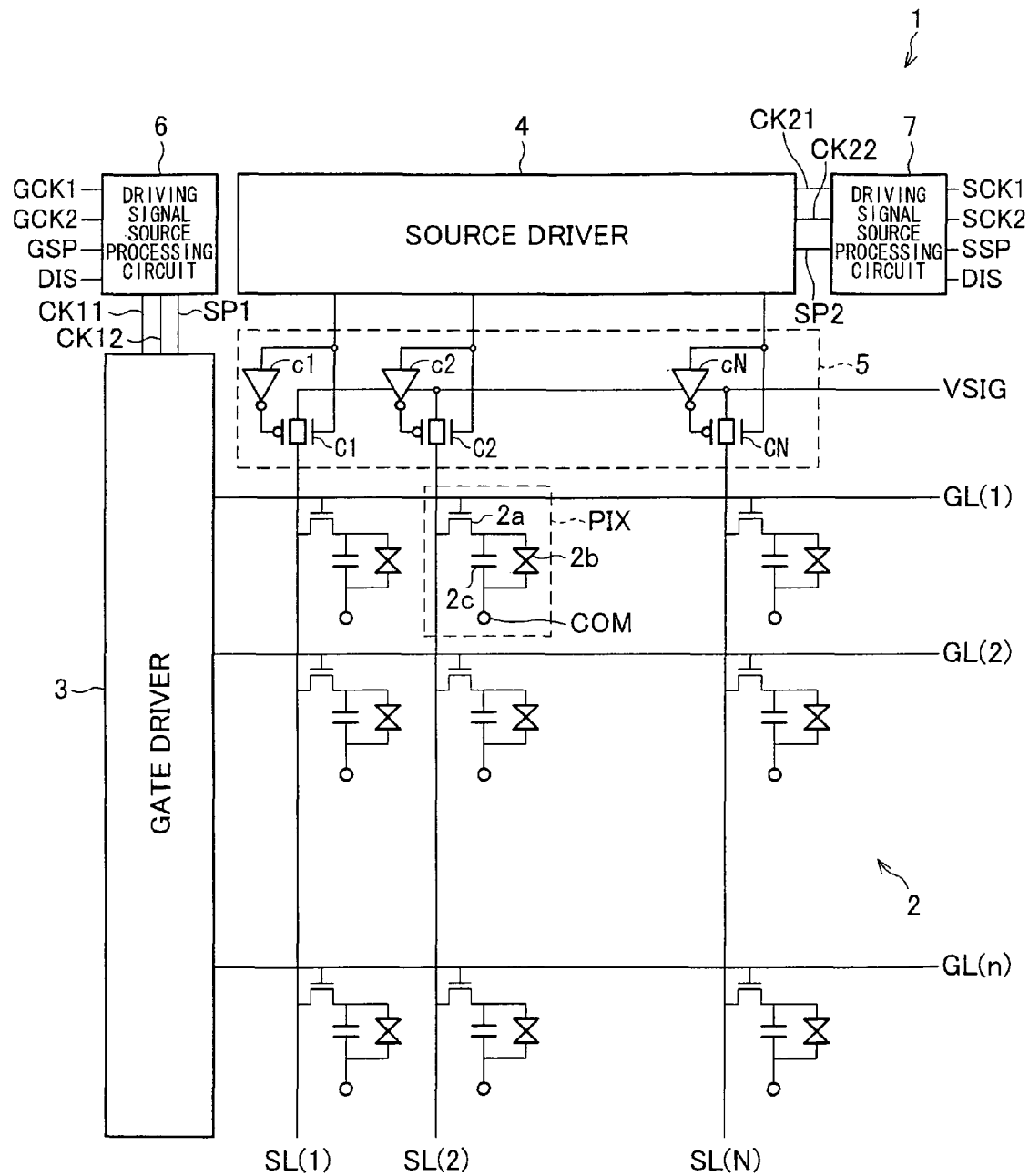
FIG. 1 is a block diagram of a main part of a liquid crystal display device according to an embodiment of the present invention.

EXPLANATION OF REFERENCE NUMERALS 1 liquid crystal display device (display device)
2 liquid crystal panel (display panel)
3 gate driver (scan signal line driving circuit, driving circuit)
4 source driver (data signal line driving circuit, driving circuit)

BEST MODE FOR CARRYING OUT THE INVENTION

The following description deals with more detailed explanation of the present invention with reference to embodiments and comparison examples. However, the present invention is not limited to these embodiments and examples.

One embodiment of the present invention is described below with reference to FIG. 1 and FIG. 7.

A configuration of a liquid crystal display device (display device) 1 of the embodiment of the present invention is illustrated in FIG. 1. The liquid crystal display device 1 includes a liquid crystal panel 2, a gate driver 3, a source driver 4, an analogue switch circuit 5, and driving signal source processing circuits 6 and 7. Note that the driving signal source processing circuits 6 and 7 may be provided as a part of the liquid crystal panel 2.

The liquid crystal display device 1 includes the liquid crystal panel 2 which is driven by a dot inversion driving in which each pixel PIX has a polarity of charge opposite to that of a pixel PIX adjacently located up, down, right or left of that pixel PIX, or is driven by a scan signal inversion driving in which pixels PIX connected to one scan signal line and pixels PIX connected to an adjacent scan signal line have opposite polarities of charge.

The liquid crystal panel 2 is an active matrix display panel which includes a plurality of scan signal lines GL (1), GL (2), . . . , GL (n), . . . , and a plurality of data signal lines SL (1), SL (2), . . . , SL (N), . . . provided so as to be intersected with each other. In each intersection, a pixel PIX is provided. The pixel PIX includes a TFT 2*a*, a liquid crystal capacitor 2*b*, and a storage capacitor 2*c*. A gate terminal of the TFT 2*a* is connected to a scan signal line GL corresponding to the pixel PIX. One source/drain terminal of the TFT 2*a* is connected to a data signal line SL corresponding to the pixel PIX, and the other source/drain terminal of the TFT 2*a* is connected to the pixel electrode of the pixel PIX. The liquid crystal capacitor 2*b* and the storage capacitor 2*c* are connected to the pixel PIX between the pixel electrode and a counter electrode COM so as to be parallel to each other.

Figure 6:
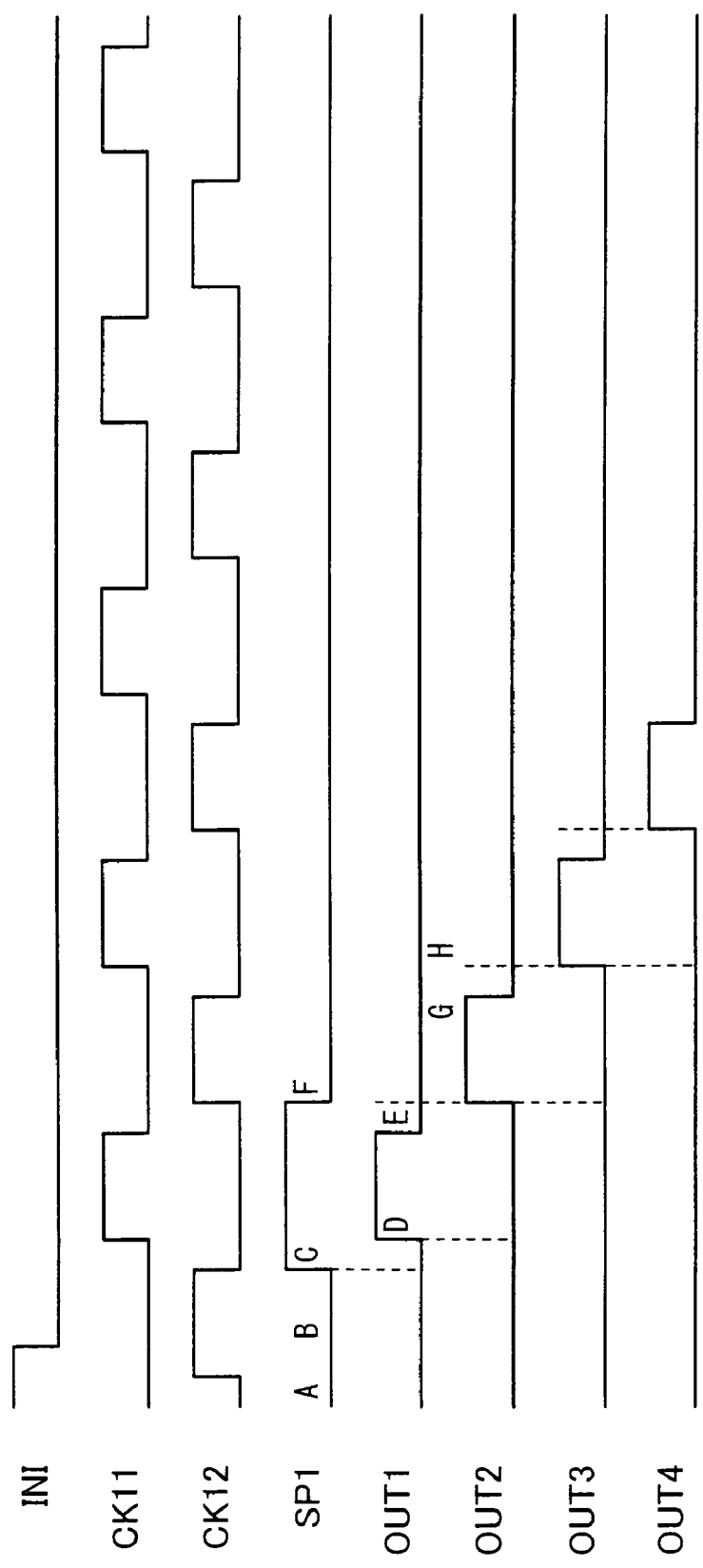
FIG. 6 is a timing chart showing an operation of the gate driver in FIG. 3 in the first mode of operation.

In the gate driver (scan signal line driving circuit) 3, in response to clock signals CK 11, CK 12 and a gate start pulse SP 1 supplied from a driving signal source processing circuit 6 (described later), an internal shift register or the internal shift register in combination with a logical circuit generate, at each stage, a scan signal which is to be supplied to a scan signal line GL. Each of the clock signals (timing signals) CK 11 and CK 12 has a different phase with each other when the liquid crystal display 1 is in normal operation as illustrated in FIG. 6 and is a binary periodic signal which repeats to change the level periodically. Here is an example that the High periods of both clock signals CK 11 and CK 12 are not overlapped each other. Also, the clock signals CK 11 and CK 12 are fixed at active level (High in this case) right before turning OFF the liquid crystal display device 1 as illustrated in FIG. 7. The start pulse SP1 has one pulse in every certain period when the liquid crystal display device 1 is in normal operation as illustrated in FIG. 6. As for the start pulse SP 1, the period is one vertical period. Further, the start pulse SP1 is fixed at active level (High in this case) right before turning OFF the liquid crystal display device 1 as illustrated in FIG. 7.

In the source driver (data signal line driving circuit) 4, in response to clock signals CK 21, CSK 22, and a start pulse signal SP 2 supplied from a driving signal source processing circuit 7 (described later), an internal shift register generates, at each stage, a control signal for an analogue switch C provided in an analogue switch circuit 5 (described later).

The analogue switch circuit 5 includes CMOS analogue switches C1, C2, . . . , CN, . . . provided corresponding to the outputs from the stages of the source driver 4, respectively. To a gate terminal of a p-channel type MOS transistor of each analogue switch C, the output signal from the stage corresponding to the source driver 4, which is level inverted by an inverter c (inverters c1, c2, . . . cN, . . . corresponding to analogue switches C1, C2, CN, . . . , respectively), is inputted. To a gate terminal of an n-channel type transistor, the output signal from the stage corresponding to the source driver 4 is directly inputted. Also, the analogue switches C1, C2, . . . , CN, . . . , are provided corresponding to the data signal lines SL (1), SL (2), . . . , SL (N), . . . , respectively so as to open and close the corresponding connections between the data signal lines SL and the video signal lines VSIG. Data signal is supplied to the video signal line VSIG and is written into a pixel PIX selected by the scan signal via a data signal line SL which is connected to the closed analogue switch.

The driving signal source processing circuit 6 generates the clock signal CK 11 from the externally supplied clock signal GCK 1 and the discharge control signal DIS, also generates the clock signal CK 12 from the externally supplied clock signal GCK 2 and the discharge control signal DIS, further generates the start pulse SP1 from the externally supplied gate start pulse GSP and the discharge control signal DIS, and outputs each of the obtained signals to the gate driver 3. The discharge control signal DIS is fixed at High level when the liquid crystal display device 1 is in normal operation, and is fixed at Low level right before turning OFF the liquid crystal display device as illustrated in FIG. 7.

The driving signal source processing circuit 7 generates the clock signal CK 21 from the externally supplied clock signal SCK 1, also generates the clock signal CK 22 from the externally supplied clock signal SCK 2, further generates the start pulse SP 2 from the externally supplied source start pulse SSP, and outputs each of the obtained signals to the source driver 4.

The explanation of the discharge signal DIS is omitted here because it is used in another configuration.

Note that it is possible to arrange the driving signal source processing circuit 6 and the driving signal source processing circuit 7 together in one place.

The configuration of the driving signal source processing circuit 6 is illustrated in FIG. 2 (a).

The driving signal source processing circuit 6 includes CMOS analogue switches 61, 62, 63, inverters 64, 65, 66, and p-channel type MOS transistors 67, 68, 69.

The analogue switch 61 opens and closes the connection between an input terminal of the clock signal GCK 1 and an output terminal of the clock signal CK 11. The analogue switch 62 opens and closes the connection between an input terminal of the clock signal GCK 2 and an output terminal of the clock signal CK 12. The analogue switch 63 opens and closes the connection between an input terminal of the gate start pulse GSP and an output terminal of the start pulse SP 1. The discharge control signal DIS is used as a control signal for each of the analogue switches 61 through 63. To a gate terminal of an n-channel type MOS transistor for each of the analogue switches 61 though 63, the discharge control signal DIS is directly inputted. To a gate terminal of a p-channel type MOS transistor of the analogue switch 61, the discharge control signal DIS, which is level inverted by the inverter 64, is inputted. To a gate terminal of a p-channel type MOS transistor of the analogue switch 62, the discharge control signal DIS, which is level inverted by the inverter 65, is inputted. To a gate terminal of a p-channel type MOS transistor of the analogue switch 63, the discharge control signal DIS, which is level inverted by the inverter 66, is inputted.

A source of the MOS transistor 67 is connected to a voltage source VDD, and a drain of the MOS transistor 67 is connected to an output terminal of the clock signal CK 11. A source of the MOS transistor 68 is connected to a voltage source VDD, and a drain of the MOS transistor 68 is connected to an output terminal of the clock signal CK 12. A source of the MOS transistor 69 is connected to a voltage source VDD, and a drain of the MOS transistor 69 is connected to an output terminal of the start pulse SP 1.

FIG. 2 (b) is a table of truth value showing which signal is outputted as the clock signals CK 11, CK 12, and the start pulse SP 1 when the discharge control signal DIS is either High or Low. When the liquid crystal display device 1 is in normal operation, the discharge control signal DIS is High, and the clock signal GCK 1 as the clock signal CK 11, the clock signal GCK 2 as the clock signal CK 12, and the start pulse GSP as the clock signal SP 1 are outputted, respectively. Right before turning OFF the liquid crystal display device 1, the discharge control signal DIS goes Low and the clock signal CK 1, the clock signal CK 2, and the start pulse SP1 go all High. Note that the analogue switches 61 through 63 may have a level shift function.

Figure 3:
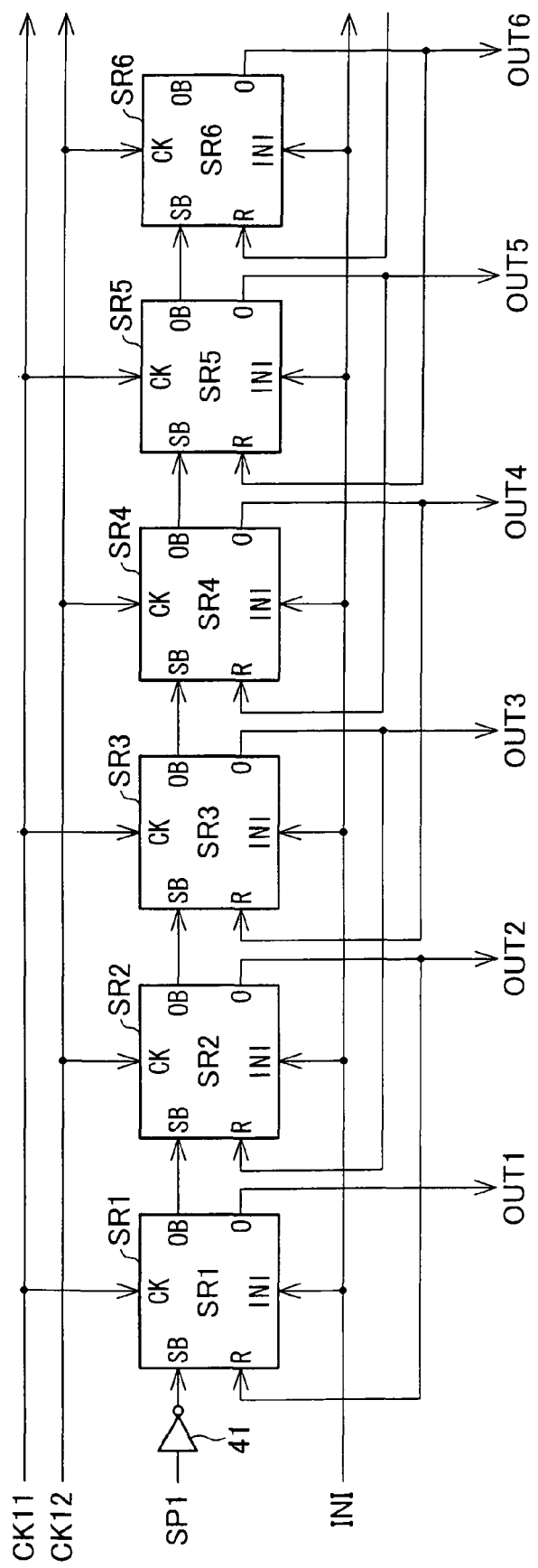
FIG. 3 is a block diagram illustrating a configuration of a gate driver in the liquid crystal display device in FIG. 1.

Next, a configuration of the gate driver 3 is illustrated in FIG. 3.

The gate driver 3 is constituted by a shift register including an inverter 41, and shift register stages SR 1, SR 2, .... The shift register stages SR 1, SR 2, ... constitute each of the stages in the shift register. Each of the shift register stages is connected in a cascade fashion from the first shift register stage in the order of SR 1 to SR 2.... Each of the shift register stages SR includes a shift signal input terminal SB, output terminals O, OB, a clock signal input terminal CK, a reset input terminal R, and an initial reset input terminal INI. The shift signal input terminal SB is a set input terminal of a low active RS flip-flop (described later). The reset input terminal R is a reset input terminal of the RS flip-flop. The clock input terminals CK receive the clock signal CK 11 supplied from the driving signal source processing circuit 6 in odd number shift register stages (SR 1, SR 3, ... ), and receive the clock signal CK 12 supplied from the driving signal source processing circuit 6 in even number shift register stages (SR 2, SR 4, ... ).

On receiving Low signal at the shift signal input terminal SB, each of the shift register stages SR outputs the signal applied to the clock input terminal CK as an output signal OUT (OUT 1 is from the first stage, OUT 2 is from the second stage, ... ) from the output terminal O, and also outputs the level inverted signal applied to the clock input terminal CK from the output terminal OB. Each of the output signals OUT is outputted to the gate signal line GL as a scan signal supplied from the gate driver 3. The signal from the output terminal OB is inputted to the shift signal input terminal SB in the next shift register stage SR. Also, the signal from the output terminal O in the next shift register stage SR is inputted to the reset input terminal R.

The inverter 41 is provided in front of the first shift register stage SR 1 for generating a level inverted signal of the start pulse SP1 supplied from the driving signal source processing circuit 6 and supplying the obtained level inverted signal to the SB terminal in the first shift register stage SR 1.

Note that the gate driver 3 may have a configuration such that the output signals OUT 1, OUT 2, ... are further inputted to the logical circuit for generating the scan signal.

Figure 4:
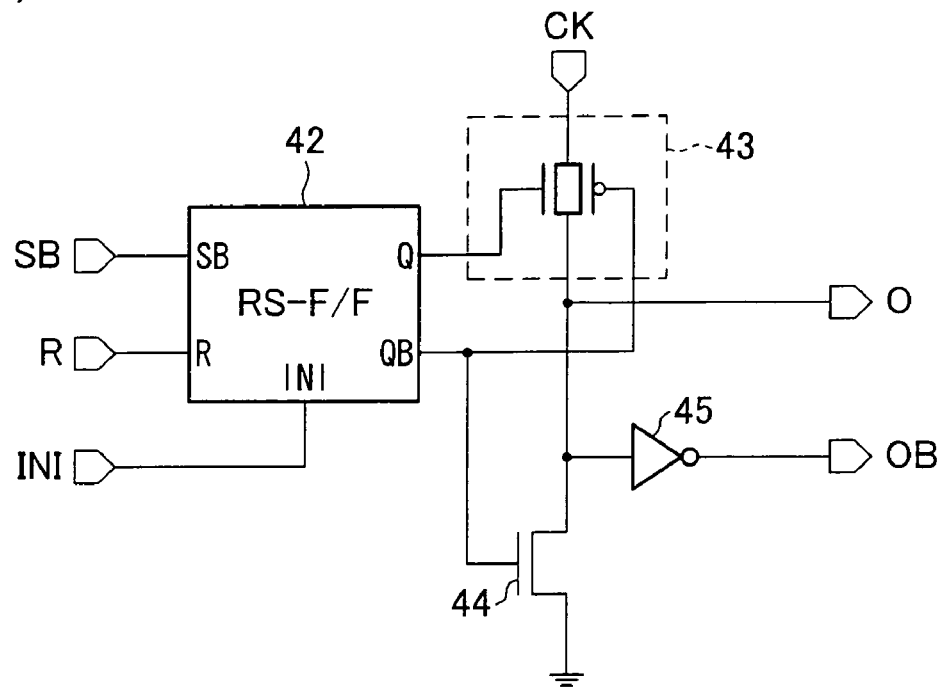
FIG. 4 (*a*) is a block diagram illustrating a configuration of a shift register in the gate driver in FIG. 3 (*a*).

Next, a configuration of each of the shift register stages SR is illustrated in FIG. 4 (a).

The shift register stage SR includes an asynchronous RS flip-flop 42, a CMOS analogue switch 43, an n-channel type MOS transistor 44, and an inverter 45.

The RS flip-flop 42 is a data latch circuit for a shift register stage SR which includes a set input terminal SB, an output terminal Q, an input terminal QB, a reset input terminal R, and an initial reset input terminal INI. The set input terminal SB and the shift signal input terminal SB of the shift register stage SR are the same. Also, the reset input terminal R and the initial reset input terminal INI equal to the reset input terminal R and the initial reset input terminal INI of the shift resister stage SR, respectively. Note that "set" means to activate the signal of the output terminal Q.

The analogue switch 43 opens and closes the connection among the clock signal input terminal CK, the output terminal O of the shift register stage SR, and an input terminal of the inverter 45. To a gate terminal of an n-channel type MOS transistor of the analogue switch 43, the output signal from the output terminal Q of the RS flip-flop 42 is inputted. To a gate terminal of a p-channel type MOS transistor, the output signal from the output terminal QB of the RS flip-flop 42 is inputted. The output terminal of the inverter 45 is the output terminal OB of the shift register stage SR. A drain terminal of the MOS transistor 44 is connected to the output terminal O and the input terminal of the inverter 45, and a source is connected to GND. To a gate terminal of the MOS transistor 44, an output signal from the output terminal QB of the RS flip-flop 42 is inputted.

FIG. 4 (b) shows truth values of output signals from the output terminals O and OB in response to the input signal to the shift signal input terminal (set input terminal) SB and the input signal to the reset input terminal R.

The RS flip-flop is designed such that an active input to a set input terminal SB has a higher priority than an active input to a reset terminal R. As shown in the table in FIG. 4 (b), when the set input terminal SB receives Low, the output terminal Q outputs High and the output terminal QB outputs Low respectively, regardless of the input, either High or Low, to the reset input terminal R (see FIG. 5 (b) described later). As a result, the output terminal O ($O_n$ in the table) outputs an input signal to the clock signal input terminal CK, and output terminal OB ($OB_n$ in the table) outputs an inverted input signal (CKB in the figure) to the clock signal input terminal CK, respectively.

Further, when the set input terminal SB receives High and the reset input terminal R receives High, the output terminal Q outputs Low and the output terminal QB outputs High, respectively (see FIG. 5 (b) described later). As a result, the output terminal O outputs Low and the output terminal OB outputs High, respectively. When the set input terminal SB receives High and the reset terminal R receives Low, the previous state of the output terminal Q, $Q_{n-1}$, is outputted from the output terminal Q as it is (see FIG. 5 (b) described later). Accordingly, if $Q_{n-1}$ is Low as the first state, the previous state of output terminal O, $O_{n-1}$, is Low. Therefore, the output terminal O ($O_n$) outputs Low, and the output terminal OB ($OB_n$) outputs High, respectively. Further, if $Q_{n-1}$ is High as the second state, the previous state of the output terminal O, $O_{n-1}$, is in a state of outputting an input signal to the clock signal input terminal CK (CK in the table). The output terminal O ($O_n$) outputs an input signal to the clock signal input terminal CK, and the output terminal OB ($OB_n$) outputs an inverted input signal (CKB in the table) to the clock signal input terminal CK, respectively.

It is possible to replace the analogue switch 43 with a circuit which has a level shifter or a logical circuit to obtain the same logic.

Figure 5:
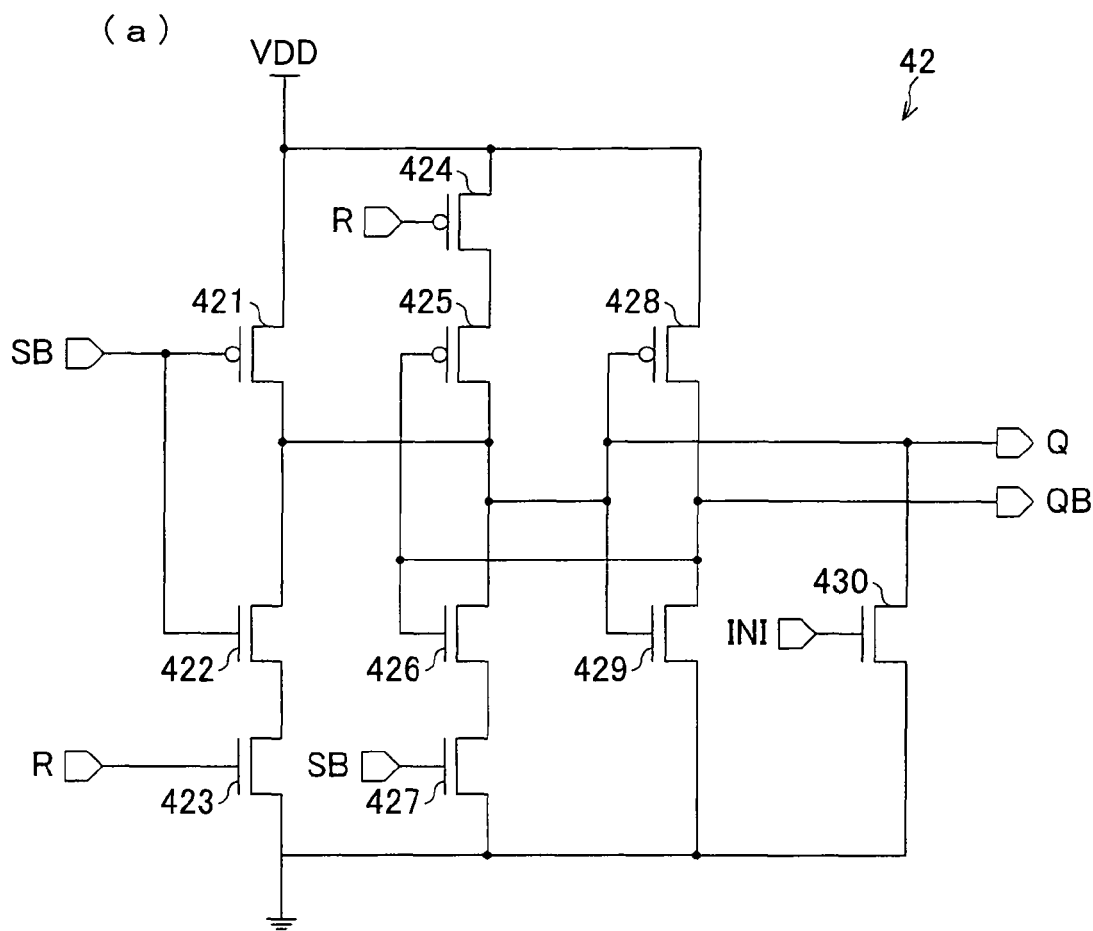
FIG. 5 (*a*) is a circuit diagram illustrating a configuration of an RS flip-flop in the shift register in FIG. 4 (*a*).

Next, the configuration of the RS flip-flop 42 is illustrated in FIG. 5 (a).

The RS flip-flop 42 includes MOS transistors 421 through 430. The MOS transistors 421, 424, 425, 428 are p-channel type, and the MOS transistors 422, 423, 426, 427, 429, 430 are n-channel type.

A source terminal of the MOS transistor 421 is connected to the voltage source VDD, and a drain terminal of the MOS transistor 421 is connected to a drain terminal of the MOS transistor 422. A source terminal of the MOS transistor 422 is connected to a drain terminal of the MOS transistor 423. Gate terminals of the MOS transistors 421 and 422 are connected to the set input terminal SB. A source terminal of the MOS transistor 423 is connected to GND. A gate terminal of the MOS transistor 423 is connected to the reset terminal R.

A source terminal of the MOS transistor 424 is connected to the voltage source VDD, and a drain terminal of the transistor 424 is connected to a source terminal of the transistor 425. A gate terminal of the MOS transistor 424 is connected to the reset terminal R. A drain terminal of the MOS transistor 425 is connected to a drain terminal of the MOS transistor 426. A gate terminal of the MOS transistor 425 is connected to a gate terminal of the MOS transistor 426. Also, a drain terminal of the MOS transistor 421 and a drain terminal of the MOS transistor 425 are connected to each other. A source terminal of the MOS transistor 426 is connected to a drain terminal of the MOS transistor 427. A source terminal of the MOS transistor 427 is connected to GND. A gate terminal of the MOS transistor 427 is connected to the set input terminal SB.

A source terminal of the MOS transistor 428 is connected to the voltage source VDD, and a drain terminal of the MOS transistor 428 is connected to a drain terminal of the MOS transistor 429. A source terminal of the MOS transistor 429 is connected to GND. A drain terminal of the MOS transistor 425 and a gate terminal of the MOS transistor 428, and a gate terminal of the MOS transistor 429 are connected to one another, and the connecting point is connected to the output terminal Q. The gate terminals of the MOS transistors 425, 426 and the connecting point between the MOS transistors 428, 429 are connected to the output terminal QB. A drain terminal of the MOS transistor 430 is connected to the output terminal Q, and a source terminal of the MOS transistor 430 is connected to GND. A gate terminal of the MOS transistor 430 is connected to the initial reset terminal INI.

FIG. 5 (b) is a truth table for output signals from the output terminal Q in response to an input signal to the set input terminal SB and an input signal to the reset terminal. FIG. 5 (b) is equivalent to FIG. 4 (b) described before, so the explanation is omitted here. According to FIG. 5 (a), the reason why an active input to the set input terminal SB has a higher priority to an active input to the reset terminal R is that when gate terminals of the MOS transistors 421 and 422 receive Low, the MOS transistor 422 becomes OFF and does not output Low to the output terminal Q, even though a gate terminal of the MOS transistor 423 receives High.

Figure 7:
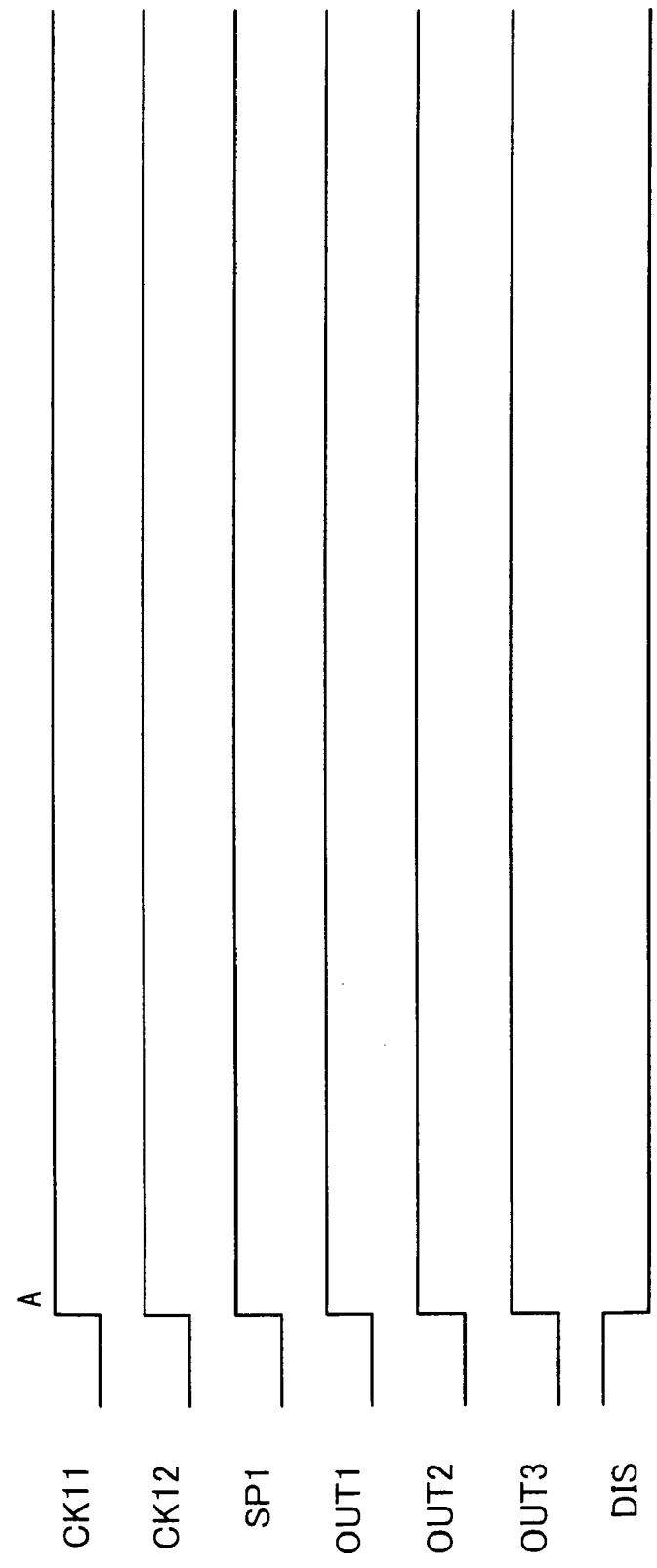
FIG. 7 is a timing chart showing an operation of the gate driver in FIG. 3 in the second mode of operation.

The following description deals with an operation of the gate driver 3 in the liquid crystal display device 1 with the above structure with reference to FIG. 6 and FIG. 7. FIG. 6 is a timing chart of the liquid crystal display device 1 in normal operation. This operation mode of the liquid crystal device 1 is called the first mode of operation. FIG. 7 is a timing chart showing a state right before turning OFF the liquid crystal display device 1. This operation mode of the liquid crystal device 1 is called the second mode of operation. The following explains the second mode of operation with reference to the FIG. 3.

At a timing A in FIG. 6, a signal inputted to the initial reset terminal (INI, hereinafter) is set to be High and the start pulse SP 1 is set to be Low. Therefore, the shift input terminal SB of the shift register stage SR 1 receives High; the output terminal O outputs Low; and the output terminal OB outputs High. Likewise, when a shift signal input terminal SB of the shift register stage SR 2 receives High and the signal INI is High, the shift register stage SR 2 outputs Low from the output terminal O and outputs High from the output terminal OB. Therefore, all the output signals OUT 1, OUT 2, . . . go Low and the initial reset of the gate driver 3 is carried out.

Next, at a timing B, the signal INI is set to be Low and the start pulse SP 1 is set to be Low. At this time, because the shift signal input terminal SB of the shift register stage SR 1 receives High and the reset terminal R receives Low, the output terminal O outputs Low and the output terminal OB outputs High. Accordingly, the shift signal input terminal SB of the shift register stage SR 2 receives High, and the output terminal O of the shift register stage SR 2 outputs Low. Thus, the entire output signals OUT 1, OUT 2, . . . remain at Low level.

Next, at a timing C, the start pulse SP 1 is set to be High, and the signal input terminal SB of the shift register stage SR 1 receives Low. Accordingly, the shift register stage SR 1 outputs the clock signal CK 11 from the output terminal O and outputs a level inverted signal of the clock signal CK 11 from the output terminal OB. Since the clock signal CK 11 is Low at the timing C, the output signal OUT 1 is Low and the output terminal OB outputs High. Thus, the entire output signals OUT 1, OUT 2, . . . remain at Low level.

Next, at a timing D, the start pulse SP 1 remains at High level, but the clock signal CK 11 goes High. Accordingly, the shift register stage SR 1 outputs High from the output terminal O, and outputs Low from the output terminal OB. Therefore, the shift signal input terminal SB of the shift register stage SR 2 receives Low, and the shift register stage SR 2 outputs the clock signal CK 12 from the output terminal O and outputs a level inverted signal of the clock signal CK 12 from the output terminal OB. Since the clock signal CK 12 is Low at the timing D, the shift register stage SR 2 outputs Low from the output terminal O and outputs High from the output terminal OB. Thus, the output signal OUT 1 goes High, and the other output signals OUT 2, OUT 3, . . . go all Low.

Next, at a timing E, the start pulse SP 1 remains at High level; the clock signal CK 11 is Low; and the clock signal CK 12 goes High. Accordingly, the shift register stage SR 1 outputs Low from the output terminal O, and outputs High from the output terminal OB. Also, the shift signal input terminal SB of the shift register stage SR 2 receives High, and the reset terminal R receives Low. Since a state of the output terminal O, $O_{n-1}$ (the state right before the timing E), is in a state of outputting the clock signal CK 12, a state of the output terminal O, $O_n$ (the state at the timing E), becomes in a state of outputting the clock signal CK 12, and a state of the output terminal OB, $OB_n$ (the state at the timing E), becomes in a state of outputting a level inverted signal of the clock signal CK 12. Thus, the entire output signals OUT 1, OUT 2, . . . go Low.

In the duration from the timing D to a timing F at which the clock signal CK 12 goes High, the start pulse SP 1 is set to be from High to Low. Accordingly, the shift signal input terminal SB of the shift register stage SR 1 receives High and the reset terminal R receives Low. Since a state of the output terminal O, $O_{n-1}$ (the state right before the start pulse SP 1 goes Low), is in a state of outputting the clock signal CK 11, a state of the output terminal O, $O_n$ (the state when the start pulse SP1 goes Low), becomes in a state of outputting the clock signal CK 11, and a state of the output terminal OB, $OB_n$ (the state when the start pulse SP 1 goes Low), becomes in a state of outputting an inverted signal of the clock signal CK 11. When the start pulse SP 1 goes Low, the clock signal CK 11 is Low. Therefore, the shift register stage SR 1 outputs Low from the output terminal O, and outputs High from the output terminal OB. Accordingly, the shift register stage SR 2 continues to output the clock signal CK 12 from the output terminal O, and to be in a state of outputting a level inverted signal of the clock CK 12 from the output terminal OB. Therefore, in the duration from the timing D to the timing F, the shift register stage SR 1 outputs Low from the output terminal O, and outputs High from the output terminal OB. As a result, the entire output signals OUT 1, OUT 2, . . . remain at Low level. Note that the start pulse SP 1 may be set to be Low at the timing F.

Next, at the timing F, the clock signal CK 12 goes High. The shift register stage SR 2 is still in a state where the output terminal O outputs the clock signal CK 12 and the output terminal OB outputs a level inverted signal of the clock signal CK 12. Therefore, the shift register stage SR 2 outputs High from the output terminal O, and outputs Low from the output terminal OB. Accordingly, the reset terminal R of the shift register stage SR 1 receives High, and the shift signal input terminal SB continues to receive High. As a result, the shift register stage SR 1 becomes in a state of reset, and outputs Low from the output terminal O and outputs High from the output terminal OB. Also, since the signal input terminal SB of the shift register SR 3 receives Low, the shift register stage SR 3 outputs the clock signal CK 11 from the output terminal O and outputs a level inverted signal of the clock signal CK 11 from the output terminal OB. Since the clock signal CK 11 is Low at the timing F, the shift register stage SR 3 outputs Low from the output terminal O and outputs High from the output terminal OB. Thus, the output signal OUT 2 goes High, and the other output signals OUT 1, OUT 3, OUT 4, . . . go all Low.

Next, at a timing G, the clock signal CK 12 goes Low. The shift register stage SR 2 is still in a state where the output terminal O outputs the clock signal CK 12 and the output terminal OB outputs a level inverted signal of the clock signal CK 12. Therefore, the shift register stage SR 2 outputs Low from the output terminal O and outputs High from the output terminal OB. Also, the shift signal input terminal SB of the shift register stage SR 3 receives High, and the reset terminal R receives Low. While a state of the output terminal O of the shift register SR 3, $O_{n-1}$ (the state right before the timing G), is in a state of outputting the clock signal CK 11, a state of the output terminal O, $O_n$ (the state of the timing G), becomes in a state of outputting the clock signal CK 11 and a state of the output terminal OB, $OB_n$ (the state of the timing G), becomes in a state of outputting a level inversion signal of the clock signal CK 11. At the timing G, the clock signal CK 11 is Low, and the shift register stage SR 1 outputs Low form the output terminal O and outputs High from the output terminal OB. Thus, the entire output signals OUT1, OUT2, . . . go Low.

Next, at a timing H, the clock signal CK 11 goes High. The shift register stage SR 3 is still in a state where the output terminal O outputs the clock signal CK 11 and the output terminal OB outputs a level inverted signal of the clock signal CK 11. Therefore, the shift register stage SR 3 outputs High from the output terminal O and outputs Low from the output terminal OB. Accordingly, the reset terminal R of the shift register stage SR 2 receives High, and the signal input terminal SB of the shift register stage SR 2 continues to receive High. Then, the shift register stage SR 2 becomes in a state of reset and outputs Low from the output terminal O and outputs High from the output terminal OB. Thus, the output signal OUT 3 goes High, and the other output signals OUT 1, OUT 2, OUT 4, . . . go Low.

In the same way, High output signal OUT is outputted from the output signal OUT 1 sequentially. These output signals OUT are not overlapped each other, and are provided to the scan signal lines GL, GL (1), GL (2), . . . in this order as High scan signals. The TFTs 2a in pixels PIX connected to a scan signal line GL which is provided High scan signal become in a conducting state all at once, and the provided video signal is written in the pixel electrode during this period. The pixel PIX displays an image in such a manner that the liquid crystal capacitor 2b and the storage capacitor 2c are charged by a voltage corresponding to a potential difference generated between a pixel electrode and a counter electrode. The potential charged in the pixel PIX is maintained until the next charge because the scan signal goes Low and disconnects the TFT 2a.

In the present embodiment, it is not necessary that the start pulses SP 1 and SP 2 are supplied to the first shift register stage SR 1 via the inverter 41 in the first mode of operation. The start pulses SP 1 and SP 2 may be supplied to the shift register stage SR 2 or later. Namely, when the start pulses SP 1 and SP 2 are supplied to a certain shift register stage SR, the output signal OUT is subsequently passed down through the stages as a pulse downstreamly.

The following description deals with the operation when the liquid crystal display device 1 turns OFF with reference to the FIG. 7.

When the direction of turning OFF the liquid crystal display 1 is provided to the liquid crystal display 1, or the direction is generated in the liquid crystal display device 1, the discharge control signal DIS is set to be Low at a timing A which is set as a predetermined timing in FIG. 7. Accordingly, the driving signal source processing circuit 6 with a configuration illustrated in FIG. 2 (*a*) set the clock signals CK 11, CK 12, and the start pulse SP 1 to be fixed at High level.

As a result, the signal input terminals SB of all the shift register stages SR 1, SR 2, . . . receive Low in FIG. 3. Therefore, the entire output signals of the gate driver 3, OUT 1, OUT 2, . . . go High. This allows the TFTs 2*a* of all the pixels PIX to be in a conducting state in union. Also, in the case where the gate driver 3 includes logical circuits in combination with the shift register with the above structure, all the logical circuits receive the same logical input because the output signals of all the shift registers go High all at once. This allows the entire output signal of the logical circuits to go High. Thus, it is possible to control the TFTs 2*a* of all the pixels PIX to be in a conducting state because High scan signal is supplied to all the scan signal lines GL.

When all the analogue switches C1, C2, . . . are set to be OFF when the electrical power supply turns OFF, it is possible to offset positive charge and negative charge among pixels which are connected to the same data signal line SL because the liquid crystal display device 1 is driven by a dot inversion driving or a scan signal line inversion driving. This allows all the pixels PIX to shift to be OFF-state having substantially equal display, as the counter electrode COM shifts to be in no-voltage state. Thus, it is possible to prevent the image degradation when the liquid crystal display device 1 turns OFF.

As above mentioned, it is possible to prevent the image degradation when all the pixels are discharged in turning OFF the display without having circuits for discharging and for preventing the image degradation which hamper downsizing and efficient area utilization of the display device.

The following description deals with the configuration of a liquid crystal display device 1 in which data signal line inversion driving is carried out in such a manner that pixels PIX connected to one data signal line and pixels PIX connected to an adjacent data signal line have opposite polarities of charge. Note that this configuration is applicable to the dot inversion driving or a scan signal line inversion driving.

In the configuration for carrying out the data signal line inversion driving illustrated in FIG. 1, the source driver 4 and the source driver 3 have the same configuration, and the driving signal source processing circuit 7 and the driving signal source processing circuit 6 have the same configuration.

Figure 8:
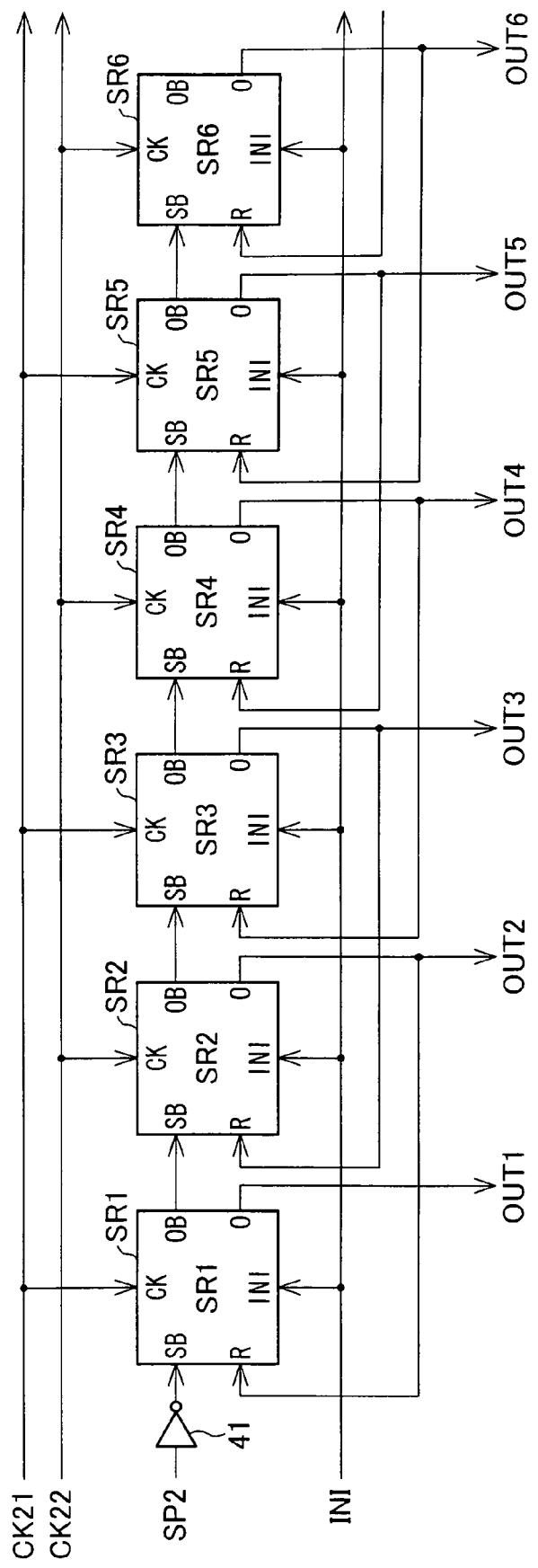
FIG. 8 is a block circuit diagram illustrating a configuration of a source driver in the liquid crystal display device 1 in FIG. 1.

As illustrated in FIG. 8, the source driver 4 is similar to the source driver 3 illustrated in FIG. 3, except that the input terminal of the clock signal CK 11 is replaced with the input terminal of the clock signal CK 21; the input terminal of the clock signal CK 12 is replaced with the input terminal of the clock signal CK 22; and the input terminal of the start pulse SP 1 is replaced with the input terminal of the start pulse SP 2. With this configuration, the output signals OUT 1, OUT 2, . . . , OUT n, . . . are the control signals of the analogue switches C1, C 2, . . . , C n, . . . , respectively.

The driving signal source processing circuit 7 generates the clock signal CK 21 from the externally supplied clock signal SCK 1 and the discharge control signal DIS, also generates the clock signal CK 22 from the externally supplied clock signal SCK 2 and the discharge control signal DIS, further generates the start pulse SP 2 from the externally supplied source start pulse SSP and the discharge control signal DIS, and outputs each of the generated signals to the source driver 4. The discharge control signal DIS is the same signal which is used for the driving signal source processing circuit 6.

Further, the configuration of the driving signal source processing circuit 7 is similar to the configuration illustrated in FIG. 2 (*a*), except that the clock signal GCK 1 is replaced with the clock signal SCK 1; the clock signal GCK 2 is replaced with the clock signal SCK 2; the gate start pulse GSP is replaced with the source start pulse SSP; the clock signal CK 11 is replaced with the clock signal CK 21; the clock signal CK 12 is replaced with the clock signal CK 22; and the start pulse SP 1 is replaced with the start pulse SP 2.

Figure 9:
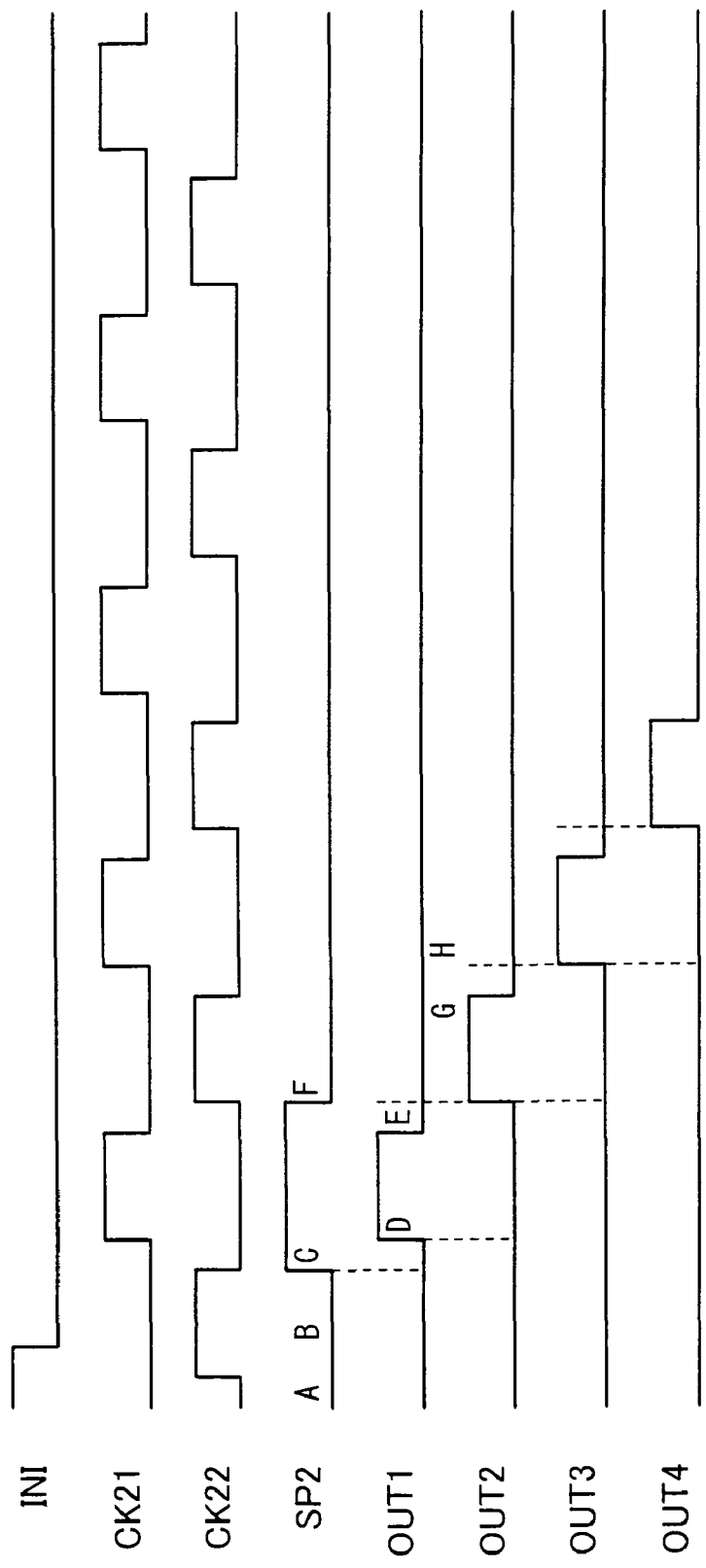
FIG. 9 is a timing chart showing an operation of the source driver in FIG. 8 in the first mode of operation.
Figure 10:
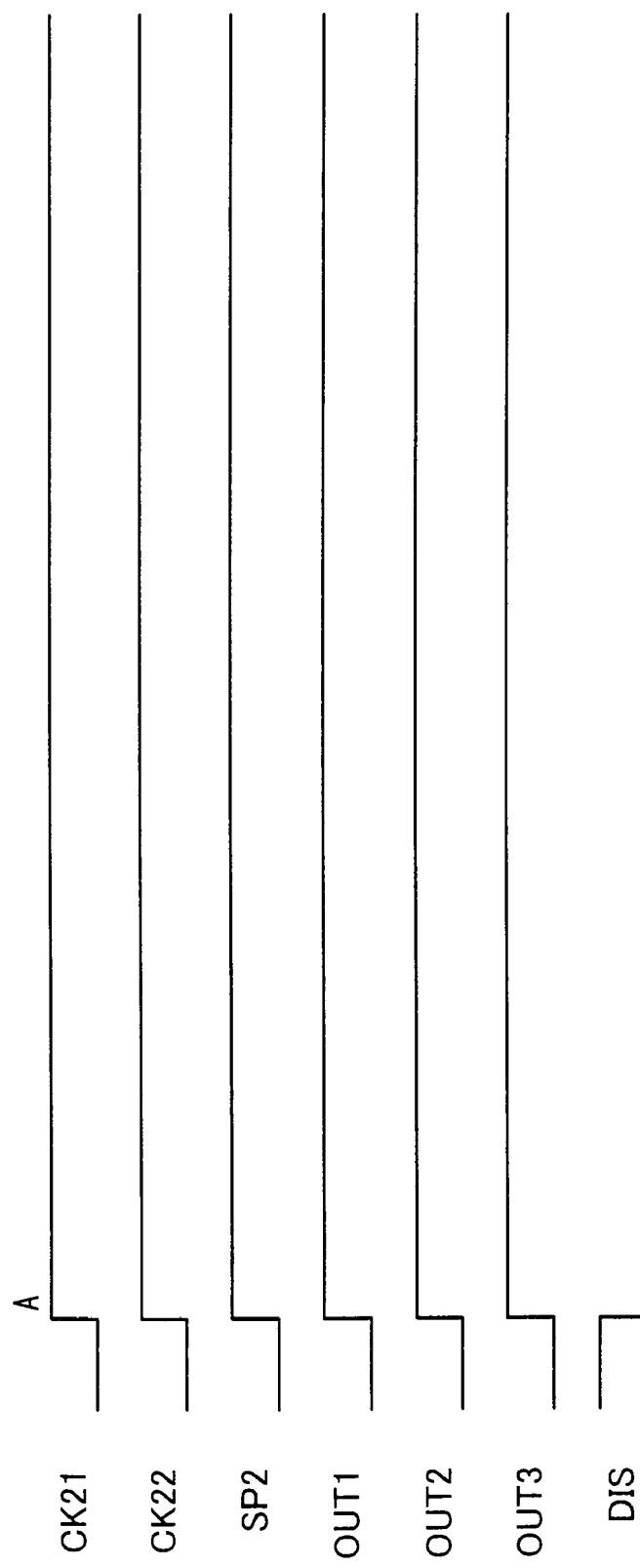
FIG. 10 is a timing chart showing an operation of the source driver in FIG. 8 in the second mode of operation.

FIG. 9 and FIG. 10 are timing charts explaining the operation of the source driver 4 and are similar to the FIG. 6 and FIG. 7, respectively, except that the clock signal CK 11 is replaced with the clock signal CK 21, the clock signal CK 12 is replaced with the clock signal CK 22, and the start pulse SP 1 is replaced with the start pulse SP 2.

Each of the clock signal (timing signal) CK 21 and the clock signal (timing signal) CK 22 has an opposite phase when the liquid crystal display device 1 is in normal operation as illustrated in FIG. 9, and is a binary periodic signal which continues to change the level periodically. An example shows the High period of the clock signal CK 21 and the High period of the clock signal CK 22 are not overlapped each other. Also, the clock signal CK 21 and the clock signal CK 22 are fixed at active level (High) right before turning OFF the liquid crystal display device 1 as illustrated in FIG. 10. The start pulse SP2 has one pulse in every certain period when the liquid crystal display device 1 is in normal operation as illustrated in FIG. 9. As for the start pulse SP 2, the certain period is one vertical period. Further, the start pulse SP 2 is fixed at active level (High) right before turning OFF the liquid crystal display device 1 as illustrated in FIG. 10.

The operation of the source driver 4 illustrated in FIG. 9 and FIG. 10 is same as the operation of the source driver 3 illustrated in FIG. 6 and FIG. 7.

When the liquid crystal display device 1 turns OFF, the entire output signals of the source driver 4, OUT 1, OUT 2, . . . go High at the timing A. Accordingly, all the analogue switches in the analogue switch circuit 5, C1, C2, . . . are closed in union.

Therefore, it is possible to completely discharge all the pixels PIX by supplying the same electric potential, which the counter electrode COM has, to the video signal lines VSIG, for example, by connecting the video signal line VSIG with the counter electrode COM. By connecting the video signal line VSIG with the counter electrode COM, when the display turns OFF, as the counter electrode COM shifts to be in no-voltage state such as GND, the potential of the pixel electrode also shifts to be in no-voltage state. Accordingly, zero voltage is applied to the liquid crystal in all the pixels PIX. This allows avoiding the variation of voltages applied to the liquid crystal and preventing the image degradation when the liquid crystal display device 1 turns OFF, even though a liquid crystal panel 2 is driven by applying alternating voltage.

As explained above, it is possible to realize the display device whose pixels are discharged in turning OFF the display device by the circuits which does not hamper the downsizing and efficient area utilization.

Also, in the above example, the potential of the counter electrode COM is applied to the video signal line VSIG for discharging pixels PIX, however, the way is not limited to this. It is possible to apply such a potential that the threshold or lower voltage (voltage does not affect display) is to be applied to the liquid crystal, to the video signal line VSIG.

This also prevents the image degradation when the liquid crystal display device 1 turns OFF, because the image display is not carried out.

Further, in FIG. 10, the entire output signals of the source driver 4 and the entire output signals of the gate driver 3 are set to go High in union. In this case, it is possible to discharge all the pixels PIX in union in the case where the liquid crystal panel 2 is driven by any alternate current driving methods, such as a dot inversion driving, scan signal inversion driving, data and signal inversion driving.

Further, as another configuration example utilizing the offset of positive and negative potentials, it is possible to disconnect the video signal lines VSIG from the data signal suppliers and close all the analogue switches C1, C2, . . . . This also allows positive and negative potential to be offset among all the pixels PIX, and all the pixels PIX to shift to be in off-state having substantially equal display when the counter electrode COM shifts to be in no-voltage state in the liquid crystal display device 1 which is driven by any alternate current driving methods, a dot inversion driving, a scan signal line inversion driving, and a data signal inversion driving. Therefore, this configuration also prevents the image degradation when the liquid crystal display device 1 turns OFF.

Further, the above configurations for preventing the image degradation in turning OFF the display device can be also used as a configuration for preventing the image degradation in turning ON the display device. Right after turning ON the display device, the potentials of the video signal, the counter electrode, Cs (storage capacitor) electrode are unstable and unexpected potential is charged in pixels. This is because a logical control of the circuit does not work properly under the unstable circumstance during the boot-up, resulting in that unnecessary potential flows into pixels from video signal lines and potential difference is generated between the counter electrode and the pixel electrode (accumulating potential) due to the unstable counter electrode potential and Cs electrode potential. This phenomenon becomes a cause of the generation of noises in the display. As a counter measure, it is useful to discharge potential by closing the switching elements of the pixels immediately when the display turns ON. It is such a quick discharge that people cannot recognize as a display.

As one example method, it is useful that (i) right after fixing the power supply voltage in turning ON the display device, activate the discharge control signal DIS as the second mode of operation for discharging pixels, and then (ii) inactive the discharging control signal DIS and shift to the normal display. It is also useful that (i) the discharge control signal DIS is activated in sync with turning ON the display device as the second mode of operation and the active state of the discharge control signal DIS is maintained until the logic of the circuit in the panel is fixed after boot-up, and then (ii) after fixing the power supply voltage, inactive the discharge control signal and shift to the normal operation.

In these methods, the gate driver 3 outputs active output signal to all the scan signal lines in response to the active discharge control signal DIS, in the case where all the analogue switches C1, C2, . . . open, between the pixels connecting to the same data signals have averaged potential and the amount of charge is substantially equalized among all the pixels, and in the case where all the analogue switches C1, C2, . . . close in union, the amount of charge is substantially leveled off among all the pixels. Namely, the potentials among pixels are equalized in a display device. Therefore, the unstable boot-up is avoidable, because unexpected display is not produced even though a period after turning ON the display and establishing the logic in the panel is prolonged. This allows preventing the image degradation in turning ON and OFF the display device without installing extra NAND circuits corresponding to each output of the driving circuits.

As explained above, it is possible to realize a display device which can prevent the image degradation when the display turns ON and OFF with use of a circuit which does not hamper downsizing and efficient area utilization of the display device.

In all the above-mentioned configurations, the polarity of the signal is one example and the present invention is applicable to the inverted logic. For example, it is easy to change the configuration to output the required polarity in the logical circuit in which the clock signals GCK 1, GCK 2, SCK 1, and SCK 2 are inputted. Therefore, in the same way, the clock signals GCK 1, GCK 2, SCK 1, SCK 2, and the start pulse signals SP 1, SP 2 may be fixed at Low level for discharging the pixels PIX when the liquid crystal display 1 turns OFF. In this case, signal level is set to be Low in sync with turning OFF the display device. This allows reducing the electric power consumption right before turning OFF the display device, and generating a signal by the action of turning OFF the display.

Also, it is not necessary for the clock signals GCK 1, GCK 2, SCK 1, SCK 2, and the start pulse SP 1, SP2, to have the same polarity in turning OFF the liquid display device 1, but is necessary to be active signals for equalizing the potential among pixels PIX.

Figure 12:
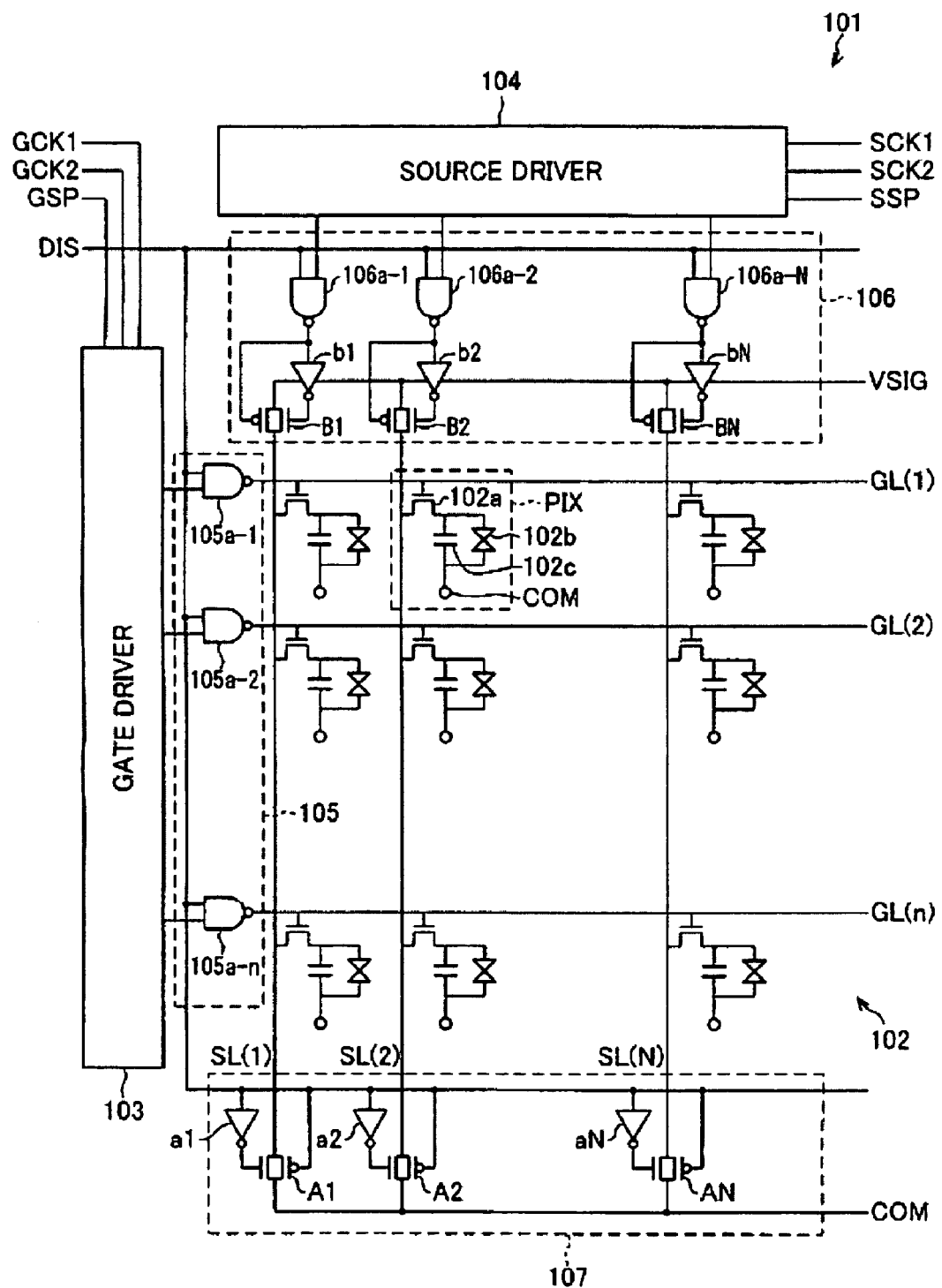
FIG. 12 is a circuit block diagram of a main part of a conventional liquid crystal display device.

Further, the liquid crystal display 1 may include a precharge circuit for precharging the data signal lines, or a discharge circuit 107 as illustrated in FIG. 12, and the pixels PIX may be discharged via the pre-charge circuit or the discharge circuit 107 as illustrated in FIG. 12 instead of discharging via the analogue switch circuit 5.

Also, any signals can be used as a reset signal for the RS flip-flops in the shift register.

Further, in the above configuration, the clock signal (timing signal) was a two-phase signal, however, three or more phase signal is also applicable to the present invention. In general, timing signal is only necessary to be corresponding to each of the shift register stages. The active periods of the clock signals may be overlapped or may not be overlapped. Also, any timing signals are available which are capable of the data transmission by the shift register in the first mode of operation in the liquid crystal display device 1.

Figure 11:
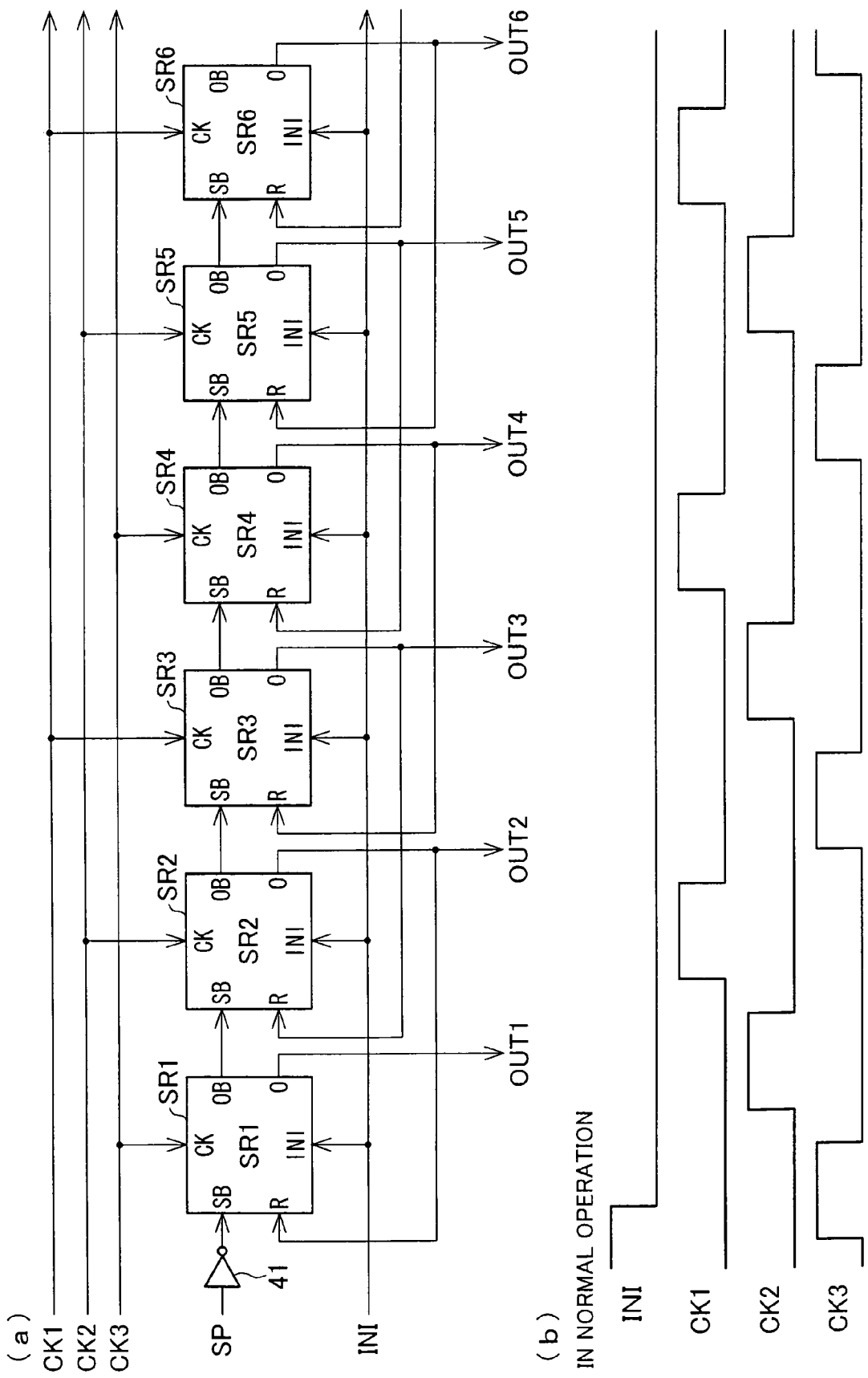
FIG. 11 (*a*) is a block diagram of a modification example of a modified driving circuit.

FIG. 11 (a) shows a configuration of a driving circuit with use of a three-phase clock signals (timing signals) CK 1, CK 2, and CK 3. The configuration in FIG. 3 allows the clock signals in a certain phase sequence CK 3, CK 2, CK 1, CK 3, CK 2, . . . to be applied to the clock signal input terminals CK of the shift register stages SR 1, SR 2, SR 3, SR 4, SR 5, . . . in this order.

FIG. 11 (b) shows wave structures of the clock signals CK 1, CK 2, and CK 3. Each of the clock signals CK 1, CK 2, and CK 3 has a different phase in normal operation of the liquid crystal display device 1 and is a binary periodic signal which repeats to change the level periodically. This example shows the High periods of the clock signals CK 1, CK 2, and CK 3 are not overlapped each other. Also, the clock signals CK 1, CK 2, CK 3 are all fixed at active level (i.e. High) right before turning OFF the liquid crystal display device 1, same as the configurations in FIG. 7 and FIG. 10. The start pulse SP is a signal equivalent to SP 1 and SP 2.

Note that the display device of the present invention includes a scan signal line driving circuit having the driving circuit. In the first mode of operation, the scan signal line driving circuit may generate a scan signal from the output signal, the scan signal including a pulse and being to be provided to the scan signal lines sequentially. In the second mode of operation, the scan signal line driving circuit may generate a signal from the output signal, the signal including a pulse and being to be provided to all the scan signal lines in union.

According to the invention, it is possible to offset positive and negative potentials between pixels which are connected to the same data signal lines with use of the second mode of operation in truing OFF the display device driven by applying alternating voltage. Therefore, the present invention has an effect which is easy to prevent the image degradation in turning OFF the display device driven by a dot inversion driving or a scan signal line inversion driving, and the circuit for preventing the image degradation does not hamper downsizing and efficient area utilization.

Further, with use of the second mode of operation in turning ON a certain display device, the potentials between pixels connected to the same data signal lines are leveled off and the charge amount of all the pixels become substantially equal. Therefore, the present invention has an effect which is easy to prevent the image degradation in turning ON a certain display device and the circuit for preventing the image degradation does not hamper downsizing and efficient area utilization.

Further, the display device of the present invention includes a scan signal line driving circuit and a data signal line driving circuit, both of which are having the driving circuit. In the first mode of operation, the scan signal line driving circuit may generate a scan signal from the output signal from the shift register in the scan signal line driving circuit, the scan signal including a pulse and being to be provided to the scan signal lines sequentially, in the second mode of operation, the scan signal line driving circuit may generate a signal from the output signal from the shift register of the scan signal line driving circuit, the signal including a pulse and being to be provided to all the scan signal lines in union. In the first mode of operation, the data signal line driving circuit may use the output signal from the shift register in the data signal line driving circuit, for providing the data signal from a video signal line to each of the data signal lines sequentially, in the second mode of operation, the data signal line driving circuit may use the output signal from the shift register in the data signal line driving circuit, for providing a same electric potential from the video signal line to all the data signal lines in union.

According to the invention, the same electric potential is provided from the video signal line to all the pixels in the second mode of operation. This allows all the pixels have a substantially equalized applied voltage. Therefore, the present invention has an effect which is easy to prevent the image degradation in turning ON a certain display device and the circuit for preventing the image degradation does not hamper downsizing and efficient area utilization.

Further, the display device of the present invention includes a scan signal line driving circuit and a data signal line driving circuit, both of which are having the driving circuit. The scan signal line driving circuit generates a scan signal including a pulse and being to be provided to each of the scan signal lines sequentially with use of the output signal from the shift register in the scan signal line driving circuit in the first mode of operation, and generates a signal including a pulse and being to be provided to all the scan signal lines in union with use of the output signal from the shift register in the scan signal line driving circuit in the second mode of operation. The data signal line driving circuit may use the output signal from the shift register in the data signal line driving circuit for providing the data signal from a video signal line to each of the data signal lines sequentially in the first mode of operation, and may use the output signal from the shift register in the data signal line driving circuit for disconnecting all the data signal lines from the video signal line and for conducting all the data signal lines with each other in the second mode of operation.

According to the invention, if the second mode of operation is used in turning OFF a display device driven by applying alternating voltage, it is possible to offset positive and negative potentials of all the pixels. Therefore, the present invention has an effect which is easy to prevent the image degradation in turning ON and OFF any display devices driven by applying alternating voltage, and the circuit for preventing the image degradation does not hamper downsizing and efficient area utilization.

Also, if the second mode of operation is used in turning ON a certain display device, it is possible to level off the amount of charge among all the pixels. Therefore, the present invention has an effect which is easy to prevent the image degradation in turning ON a certain display device, and the circuit for preventing the image degradation does not hamper downsizing and efficient area utilization.

The present invention is not limited to the above embodiment. Wide variety of alteration is available within the range defined in claims. Namely, any embodiments that will be obtained by combining the technical means, which are altered within the range defined in claims as needed, should also be included in the technical scope of the present invention. For example, a liquid crystal display device is exemplified as a display device of an embodiment of the present invention. The present invention is not limited to the liquid crystal display device, and is applicable to display devices which display images by charging a pixel.

INDUSTRIAL APPLICABILITY

The present invention is useful for the liquid crystal display device.

The invention claimed is:

1. A display device in which an active matrix display panel is driven by a driving circuit, the display device comprising:
 a shift register including a plurality of stages connected in a cascade fashion, each stage including an RS flip-flop in which an active input to a set input terminal has a higher priority than an active input to a reset input terminal, the RS flip-flop operating as a data latch circuit, each stage outputting a respective output signal,
 the shift register configured to operate in a first mode of operation and a second mode of operation,
 wherein the first mode of operation includes (i) supplying a signal to the set input terminal of the RS flip-flop of a predetermined stage among the plurality of stages, (ii) sequentially transferring the signal downstream through the predetermined stage and subsequent stages based on timing signals and (iii) sequentially outputting the output signal from the predetermined stage and the subsequent stage in response to the timing signals,
 wherein the second mode of operation includes setting all of the output signals to be active in union by supplying an active input to the set input terminal of the RS flip-flop in a first stage of the plurality of stages.

2. The display device as set forth in claim 1 comprising:
 a scan signal line driving circuit including the driving circuit, wherein
 in the first mode of operation, the scan signal line driving circuit generates scan signals from the output signals to be sequentially provided to a plurality of scan signal lines; and in the second mode of operation, the scan signal line driving circuit generates the scan signals from the output signals to be provided to all of the plurality of scan signal lines in union.

3. The display device as set forth in claim 1 comprising:

a scan signal line driving circuit and a data signal line driving circuit, both of which are included in the driving circuit, wherein in the first mode of operation, the scan signal line driving circuit generates scan signals from the output signals to be sequentially provided to a plurality of scan signal lines; and in the second mode of operation, the scan signal line driving circuit generates the scan signals from the output signals to be provided to all of the plurality of scan signal lines in union; and in the first mode of operation, the data signal line driving circuit uses the output signals from the shift register in the data signal line driving circuit, for sequentially providing data signals to a plurality of data signal lines, in the second mode of operation, the data signal line driving circuit uses the output signals from the shift register in the data signal line driving circuit, for providing a same electric potential to all of the plurality of data signal lines in union.

4. The display device as set forth in claim 1 comprising:

a scan signal line driving circuit and a data signal line driving circuit, both of which are included in the driving circuit, wherein in the first mode of operation, the scan signal line driving circuit generates scan signals to be sequentially provided to a plurality of scan signal lines based on the output signals from the shift register in the scan signal line driving circuit, in the second mode of operation, the scan signal line driving circuit generates the scan signals to be provided to all of the plurality of scan signal lines in union based on the output signals from the shift register in the scan signal line driving circuit; and in the first mode of operation, the data signal line driving circuit uses the output signals from the shift register in the data signal line driving circuit for sequentially providing data signals from a video signal line to a plurality of data signal lines, in the second mode of operation, the data signal line driving circuit uses the output signals from the shift register in the data signal line driving circuit for one of (i) disconnecting all of the plurality of data signal lines from the video signal line and (ii) conducting all of the plurality of data signal lines with each other.

5. A method for driving a display device in which an active matrix display panel is driven by a driving circuit, the driving circuit including a shift resister having a plurality of stages connected in a cascade fashion, each stage including an RS flip-flop in which an active input to a set input terminal has a higher priority than an active input to a reset input terminal, the RS flip-flop operating as a data latch circuit, the method comprising:

performing a first mode of operation, the first mode of operation including (i) supplying a signal to the set input terminal of the RS flip-flop of a predetermined stage among the plurality of stages, (ii) sequentially transferring the signal downstream through the predetermined stage and subsequent stages based on timing signals and (iii) sequentially outputting the output signals from the predetermined stage and the subsequent stages in response to the timing signals; and performing a second mode of operation, the second mode of operation including setting all of the output signals to be active in union by supplying an active input to the set input terminal of the RS flip-flop in a first stage of the plurality of stages.

* * * * *